United States Patent
Xie

(10) Patent No.: US 8,159,258 B2
(45) Date of Patent: *Apr. 17, 2012

(54) POWER SUPPLY TESTING SYSTEM

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 229 days.

This patent is subject to a terminal disclaimer.

(21) Appl. No.: 12/576,855

(22) Filed: Oct. 9, 2009

(65) Prior Publication Data
US 2010/0327901 A1    Dec. 30, 2010

(30) Foreign Application Priority Data
Jun. 26, 2009 (CN) .......................... 2009 1 0303768

(51) Int. Cl.
G01R 31/40 (2006.01)
G01R 31/26 (2006.01)

(52) U.S. Cl. .................. 324/764.01; 324/762.01

(58) Field of Classification Search ........... 324/762.01–762.09, 760.01–760.02, 324/754.01–754.3, 117 H, 117 R, 142; 257/208–209, 355–256, 48; 438/381, 303, 438/592, 683
See application file for complete search history.

(56) References Cited

U.S. PATENT DOCUMENTS

| | | | |
|---|---|---|---|
| 4,498,138 A * | 2/1985 | Moore | 702/60 |
| 6,437,595 B1 * | 8/2002 | Boorananut et al. | 324/762.02 |
| 2011/0163776 A1 * | 7/2011 | Xie | 324/764.01 |

* cited by examiner

*Primary Examiner* — Jermele M Hollington
*Assistant Examiner* — Tung X Nguyen
(74) *Attorney, Agent, or Firm* — Altis Law Group, Inc.

(57) ABSTRACT

A testing system for testing a conversion efficiency of a power supply unit (PSU) includes a power meter, a plurality of switches, a multimeter, a microcontroller unit, and a data processing device. The power meter is utilized to measure an input power supplied to the power supply unit. The multimeter is utilized to measure an output power of PSU. The microcontroller unit is configured for automatically switching the plurality of switches for enabling the multimeter to measure the output power of power supply. The data processing device is utilized to read data measured from the power meter and the multimeter and calculate a conversion efficiency of the PSU.

18 Claims, 4 Drawing Sheets

Pn) can be calculated.

POWER SUPPLY TESTING SYSTEM

BACKGROUND

1. Technical Field

The present disclosure relates to a testing system, and more particularly to a testing system for testing conversion efficiency of a power supply.

2. Description of Related Art

Since the energy policy of different countries varies, most of the present power supply devices adopt a specification that maintains a conversion efficiency of the Power Supply Unit (PSU) over 80%. The conversion efficiency is the ratio of direct current (DC) output power to alternating current (AC) input power, expressed in percentage, with 100% being perfect. If a PSU requires an input of 400 W in AC to deliver 300 W in DC, then it has an efficiency of 75%, at this point, and 25% of the power is lost as heat within the power supply.

Referring to FIG. 4, a typical testing system for testing a conversion efficiency of a PSU 300 includes a AC source 100 applied to the PSU 300, a power meter 200, a first multimeter 400, a second multimeter 500, a first rotary switch 51, a second rotary switch S2, a third rotary switch S3, and a DC electronic load 600. The switches S1, S2, S3 are 1 pole 6 way switches. The power meter 200 is connected between the AC source 100 and the PSU 300 for measuring AC input power to the PSU 300. The PSU 300 output power rails include: 12V, 12 VCPU (a power rail for CPU), 5V, 3.3V, −12V, and 5 Vaux (standby voltage of 5V). Each of the power rails' output from the PSU 300 is supplied to the DC electronic load 600 via a resistor. The first rotary switch S1 is turned from one conducting position to another. Thus, the first multimeter 400 is capable of connecting to each of the power rails and measuring an effective output voltage of each of the power rails. The rotary switches S2, S3 are turned from one conduction position to another for connecting the second multimeter 500 to each of the resistors in a parallel connection. Thus, an output current of each of the power rails can be calculated using the formula: I=U/R. An output power of each of the power rails can be calculated by the formula: P=UI. A total output power of the PSU 300 equals the sum of all the output power of the power rails. Then the conversion efficiency of the PSU 300 equal to a ratio of the total output power of the PSU 300 to the AC input power can be calculated to determine whether the PSU 300 achieves the standard.

However, the typical testing system needs an operator to manually turn the rotary switches and record the current and voltage of each of the power rails, which is inefficient.

DETAILED DESCRIPTION OF THE EMBODIMENTS

Figure 1:
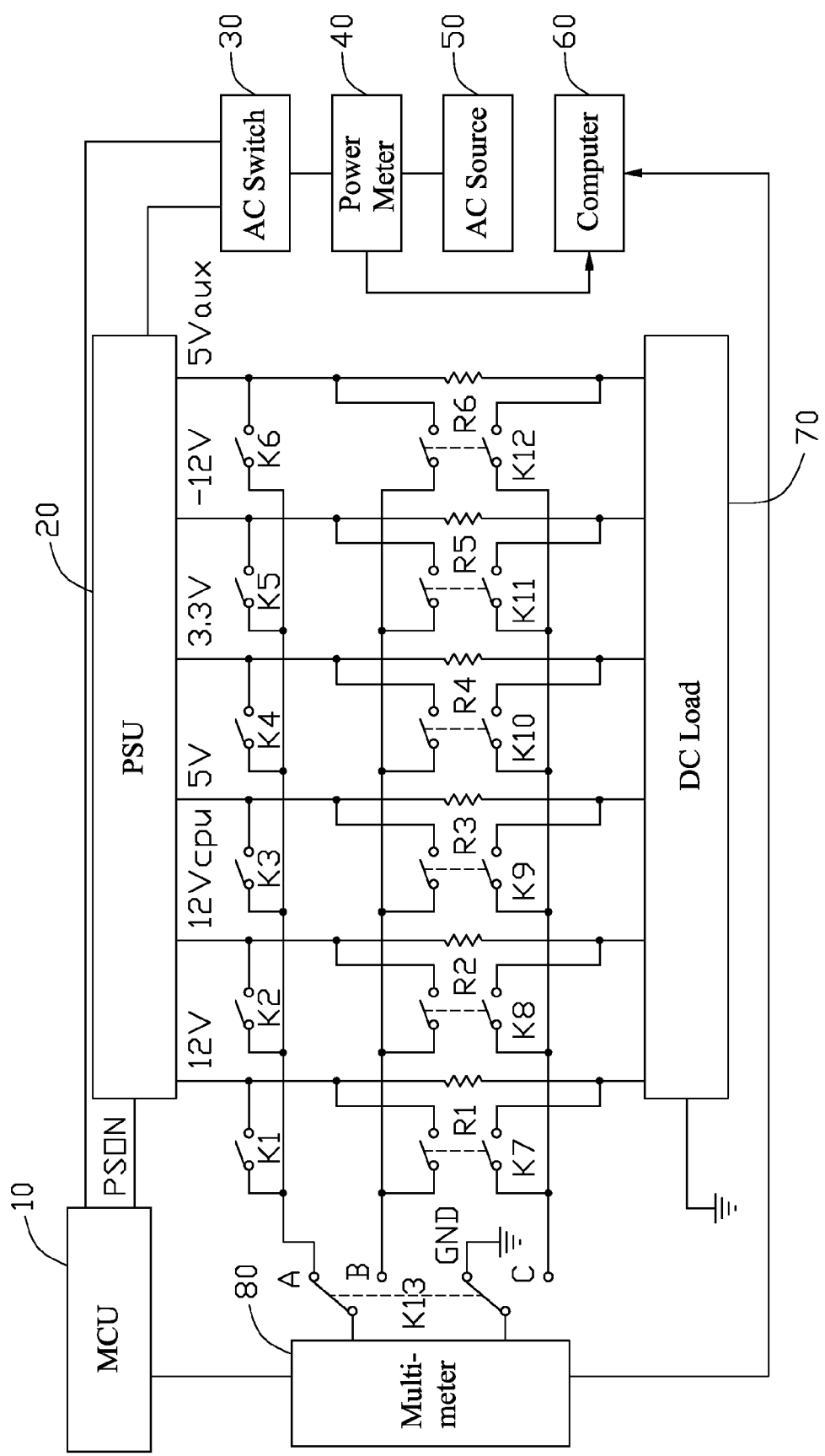
FIG. 1 illustrates a testing system for testing a conversion efficiency of a power supply unit (PSU)

Referring to FIG. 1, an embodiment of a testing system for testing a conversion efficiency of a PSU 20 includes an MCU 10, an AC switch 30, a power meter 40, an AC source 50, a computer 60, a DC electronic load 70, and a plurality of switches K1-K13. The PSU 20 is capable of outputting power rails of 12V, 12 Vcpu, 5V, 3.3V, −12V, 5 Vaux respectively coupled to resistors R1, R2, R3, R4, R5, R6. The power rails output from the PSU 20 are supplied to the DC load 70 via the resistors R1-R6. The computer 60 is a data processing device for calculating a conversion efficiency of the PSU 20.

The MCU 10 sends a signal to control the AC switch 30 and sends a power supply on (PSON) signal to the PSU 20. The AC switch 30 is configured to electrically connect/disconnect the AC source 50 to/from the PSU 20. When the AC source 50 is electrically connected to the PSU 20 and the PSON signal is at a low level (logic "0"), the PSU 20 is powered on and outputs the power rails.

The MCU 10 further sends signals to control On/Off states of the switches K1-K13. The switch K13 is a double pole-double throw switch. When the switch K13 is turned to a contact point A and ground in a first closed position, the multimeter 80 can measure an effective voltage of each of the power rails after each of the switches K1-K6 is closed in turn. For example, if the switch K13 is turned to the contact point A and ground (GND) and the switch K1 is closed, and keeping other switches open, the multimeter 80 is connected to power rail of 12V and capable of measuring the effective voltage of the 12V power rail. If the switch K13 is turned to the contact point A and ground (GND) and the switch K2 is closed, keeping other switches open, the multimeter 80 can measure the effective voltage of the 12 Vcpu power rail.

When the switch K13 is turned to contact points B&C and at a second closed position, the multimeter 80 can measure a voltage drop across each of the resistors R1-R6. For example, if the switch K13 is turned to contact points B&C and the switch K7 is turned to a closed position, keeping other switches open, the multimeter 80 and the resistor R1 are connected in parallel, and the multimeter 80 can measure the voltage drop across the resistor R1. A current flow through each of the resistors R1-R6 can be calculated using the formula: I=U/R. An output power of each of the power rails can be calculated using the formula: P=UI. Then a total output power of the PSU 20 equal to a sum of the output powers of all the power rails (P=P1+P2+P3+ . . . Pn) can be calculated.

An AC input power applied to the PSU 20 can be measured by the power meter 50. Thus, a conversion efficiency of the PSU 20 that equals a ratio of the total output power to the AC input power can be calculated.

Figure 2:
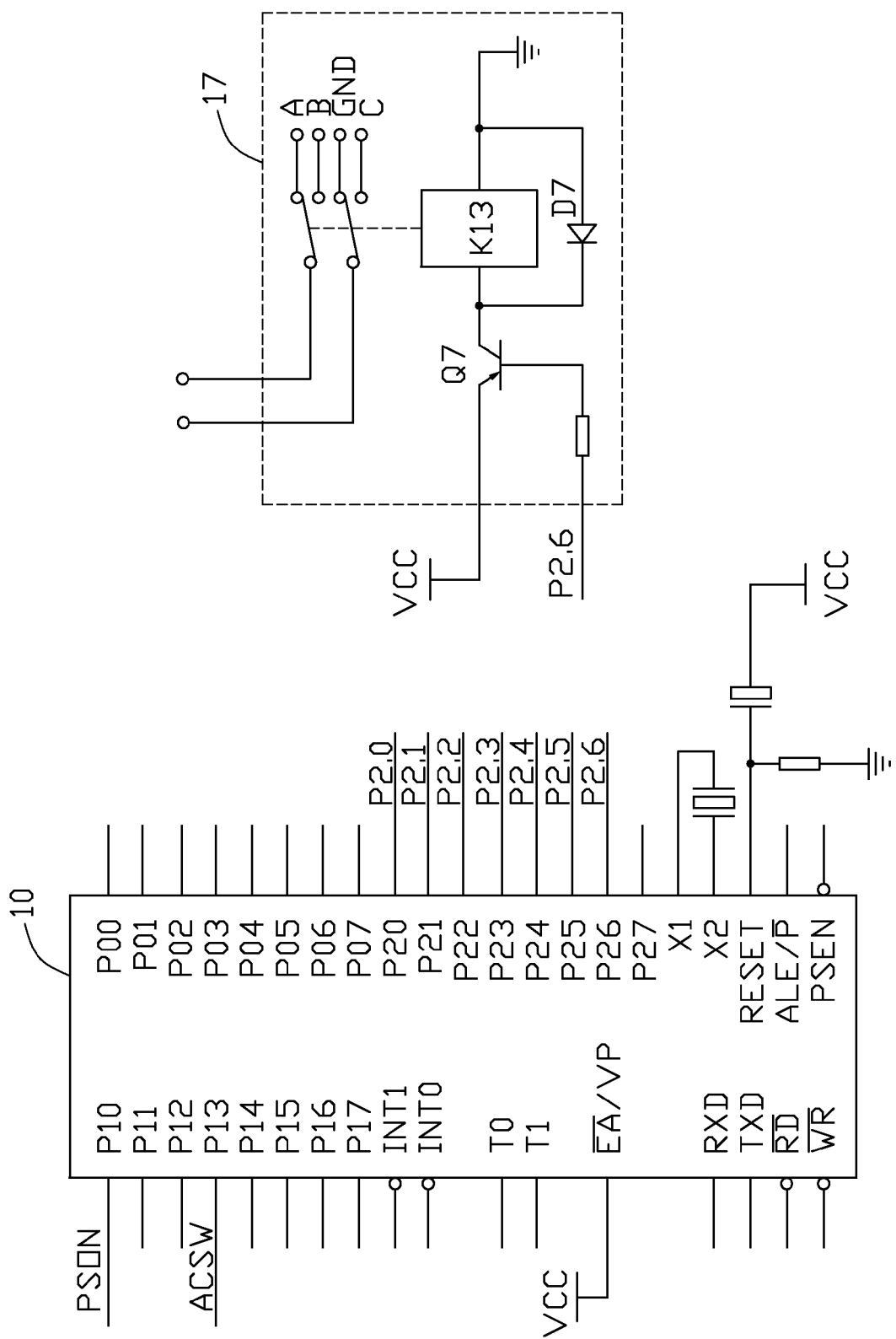
FIG. 2 depicts a single chip microcontroller (hereinafter MCU) and one peripheral circuit coupled to the MCU.
Figure 3:
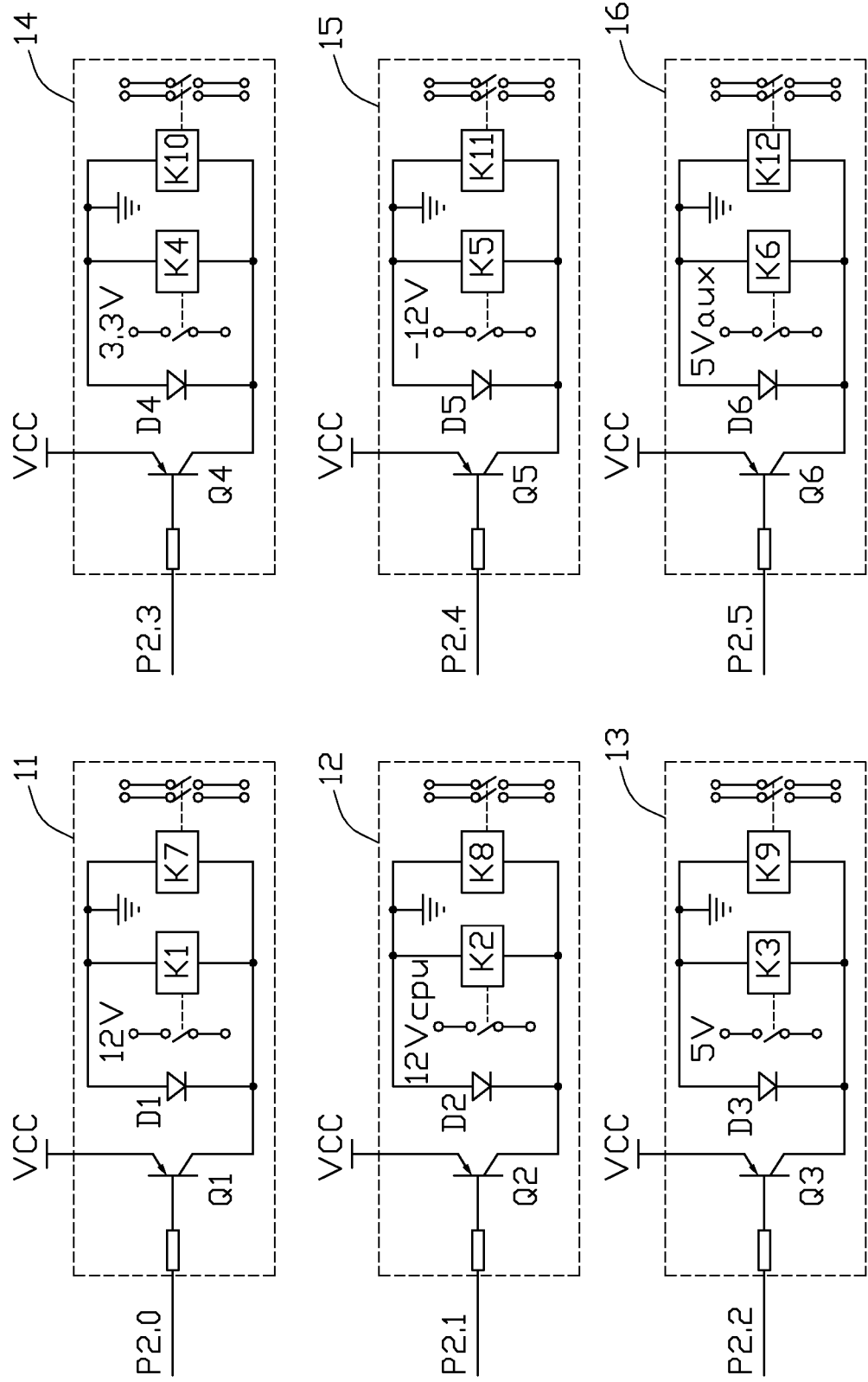
FIG. 3 depicts other peripheral circuits coupled to the MCU.
Figure 4:
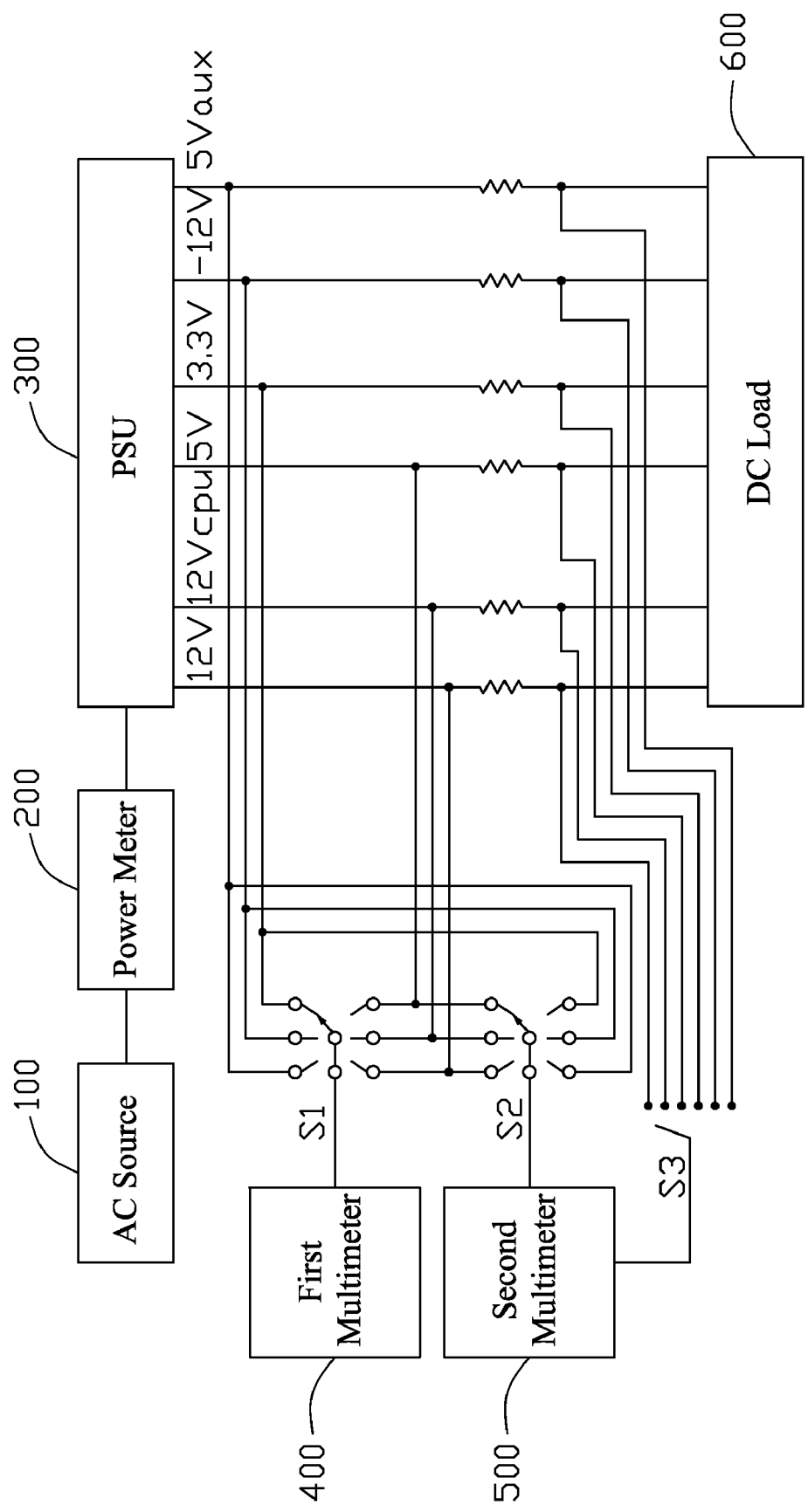
FIG. 4 depicts a typical testing system, according to the prior art, for testing a conversion efficiency of a power supply unit (PSU).

Referring also to FIGS. 2 and 3, pins P2.0-P2.6 of the PSU 20 respectively connect to a first switch circuit 11, a second switch circuit 12, a third switch circuit 13, a fourth switch circuit 14, a fifth switch circuit 15, a sixth switch circuit 16, and a seventh switch circuit 17, for controlling On/Off states of the switches K1-K13. A pin P13 of the PSU 10 sends an alternating current switch (AC SW) signal to control the AC switch 30 for electrically connecting the AC source 50 to the PSU 20. A pin P10 of the PSU 10 sends a low level PSON signal to the PSU 20 to power on the PSU 20.

The first switch circuit 11 includes a first PNP transistor Q1, a first diode D1, and the switches K1, K7. A base electrode of the transistor Q1 connects to the pin P2.0 of the MCU 10 via a resistor. An emitting electrode of the transistor Q1 is fed with a power source VCC. A collecting electrode of the transistor Q1 is connected to a cathode of the first diode D1. An anode of the first diode D1 is connected to ground. The switch K1 is a single pole-single throw relay switch, and the switch K7 is a double pole-single throw relay switch. The first diode D1, switches K1, K7 are connected in parallel. When the pin P2.0 of the MCU 10 sends a high level signal to the base electrode of the transistor Q1, the transistor Q1 is rendered non-conductive; a voltage level of the collecting electrode of the transistor Q1 is low; and there is nearly no current flowing through a relay coil (not shown) of each of the switches K1, K7, thereby keeping the switches K1, K7 open. When the pin P2.0 of the MCU 10 sends a low level signal to the base electrode of the transistor Q1, the transistor Q1 is rendered conductive; a voltage level of the collecting electrode of the transistor Q1 is high; and there is an electric current (exceeding a threshold current to turn on the relay switch) flowing through the relay coil of each of the switches K1, K7, thereby turning on the switches K1, K7.

The second switch circuit 12 includes a second PNP transistor Q2, a second diode D2, and the switches K2, K8. The switch K2 is a single pole single throw relay switch, and the switch K8 is a double pole single throw relay switch.

The third switch circuit 13 includes a third PNP transistor Q3, a third diode D3, and the switches K3, K9. The switch K3 is a single pole single throw relay switch, and the switch K9 is a double pole single throw relay switch.

The fourth switch circuit 14 includes a fourth PNP transistor Q4, a fourth diode D4, and the switches K4, K10. The switch K4 is a single pole single throw relay switch, and the switch K10 is a double pole single throw relay switch.

The fifth switch circuit 15 includes a fifth PNP transistor Q5, a fifth diode D5, and the switches K5, K11. The switch K5 is a single pole single throw relay switch, and the switch K11 is a double pole single throw relay switch.

The sixth switch circuit 16 includes a sixth PNP transistor Q6, a sixth diode D6, and the switches K6, K12. The switches K6, K12 are both double pole single throw relay switches that are controlled by the MCU 10.

In one embodiment, an operation principle of each of the second switch circuit 12, the third switch circuit 13, the fourth switch circuit 14, the fifth switch circuit 15, and the sixth switch circuit 16 is similar to that of the first switch circuit 11 described above.

The seventh switch circuit 17 includes a seventh PNP transistor Q7, a seventh diode D7, and the switch K13. The switch K13 is a double pole double throw relay switch. The switch K13 is controlled by the MCU 10 and capable of turning to a first closed position (an original position) electrically connecting to the contact point A and ground (GND) or a second closed position electrically connecting to the contact points B&C. When the pin P2.6 of the MCU 10 sends a high level signal to a base electrode of the transistor Q7, the transistor Q7 is rendered non-conductive; a voltage level of a collecting electrode of the transistor Q7 is low; there is nearly no a current flow through a coil (not shown) of the relay switch K13; and the switch K13 remains at the first closed position (original position). When the pin P2.6 of the MCU 10 sends a low level signal to a base electrode of the transistor Q7, the transistor Q7 is rendered conductive; a voltage level of a collecting electrode of the transistor Q7 is high; a current flow through the coil (not shown) of the relay switch K13 exceeds a threshold current that turns the switch K13 to the second closed position from the first closed position.

During testing, the switches K1-K13 is switched on/off according to a sequence predetermined by the MCU 10, and the multimeter 80 measures the effective output voltage on each of the power rails of the PSU 20, measures the drop voltage across each of the resistors R1-R6, and sends the measured data to the computer 60. The power meter 40 measures the AC input power supplied to the PSU 10 and sends the measured data to the computer 60. The computer 60 stores data of the resistors R1-R7 and has great data processing capability to calculate the current flow of each of the power rails of the PSU 20 using the formula I=U/R, the total output power of the PSU 20, and the conversion efficiency of the PSU 20. Then the computer 60 compares the conversion efficiency of the PSU 20 with the standard ratio (such as 80%) and determines whether the conversion efficiency of the PSU 20 meets the standard.

While the present disclosure has illustrated by the description preferred embodiments, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

The invention claimed is:

1. A system comprising:
a power supply unit supplied with an alternating current (AC) power source, the power supply unit capable of supplying a plurality of power rails to an electronic load;
a power meter connected between the AC power source and the power supply unit and capable of measuring an input power supplied to the power supply unit;
a plurality of switches;
a multimeter capable of connecting to each of the power rails via at least one of the plurality of switches for measuring an output power of each of the power rails;
a microcontroller unit for automatically switching the plurality of switches for enabling the multimeter to measure the output power of each of the power rails; and
a data processing device for reading data measured from the power meter and the multimeter and calculating a conversion efficiency of the power supply unit.

2. The system of claim 1, wherein the plurality of switches comprises a double pole-double throw switch capable of switching from a first closed position to a second closed position.

3. The system of claim 2, wherein the multimeter is capable of measuring an effective output voltage of each of the power rails of the power supply unit when the double pole-double throw switch is at the first closed position.

4. The system of claim 3, wherein the plurality of switches further comprises a single pole-single throw switch connected to each of the power rails; the multimeter is capable of measuring the effective output voltage of each of the power rails when the double pole-double throw switch is at the first closed position and the single pole-single throw switch is closed.

5. The system of claim 2, wherein each of the power rails is supplied to the electronic load via a resistor, the multimeter is capable of measuring a voltage drop across the resistor when the double pole-double throw switch is at the second closed position.

6. The system of claim 5, wherein the plurality of switches further comprises a double pole-single throw switch connected to two ends of the resistor, the multimeter is capable of measuring a voltage drop across the resistor when the double pole-double throw switch is at the second closed position and the double pole-single throw switch is closed.

7. The system of claim 1, wherein the plurality of switches are relay switches controlled by the microcontroller unit.

8. The system of claim 1, further comprising an AC switch connected to the microcontroller unit, the AC switch is capable of electrically connecting or disconnecting the AC power source to or from the power supply unit.

9. The system of claim 1, wherein the microcontroller unit is connected to the power supply unit and capable of sending a power on signal to the power supply unit.

10. A system comprising:
a power supply unit supplied with an alternating current (AC) power source, the power supply unit is capable of supplying a plurality of power rails to an electronic load;
a power meter connected between the AC power source and the power supply unit and capable of measuring an input power fed to the power supply unit;
a microcontroller unit connected with a plurality of switch circuits; and
a multimeter connected to power supply unit, the multimeter capable of measuring an output power of each of the power rails of the power supply unit the switch circuits operate according to a predetermined sequence.

11. The system of claim 10, wherein the plurality of switch circuits includes a first type of switch circuit connected to each of the power rails of the power supply unit, and a second type of switch circuit connected to the multimeter.

12. The system of claim 11, wherein the second type of switch circuit includes a double pole-double throw switch capable of switching from a first closed position to a second closed position.

13. The system of claim 12, wherein each of the power rails is supplied to the electronic load via a resistor, the multimeter is capable of measuring an effective output voltage of each of the power rails of the power supply unit when the double pole-double throw switch is at the first closed position and capable of measuring a voltage drop across the resistor when the double pole-double throw switch is at the second closed position.

14. The system of claim 13, wherein the first type of switch circuit includes a first switch connected to each of the power rails and a second switch connected to two ends of the resistor; the multimeter is capable of measuring an effective output voltage of each of the power rails of the power supply unit when the double pole-double throw switch is at the first closed position and the first switch is closed; the multimeter is capable of measuring a voltage drop across the resistor when the double pole-double throw switch is at the second closed position and the second switch is closed.

15. The system of claim 14, wherein the first switch is a single pole-single throw switch, and the second switch is a double pole-single throw switch.

16. The system of claim 14, wherein the switches of the first type of switch circuit and the second type of switch circuit are relay switches controlled by the microcontroller unit.

17. The system of claim 10, wherein each of the switch circuits comprises a PNP transistor connected to the microcontroller unit, and a diode connected to the transistor.

18. The system of claim 17, wherein each of the switch circuits further comprises at least a switch connected to the diode in parallel.

* * * * *